United States Patent
Das et al.

(10) Patent No.: US 6,591,203 B1
(45) Date of Patent: Jul. 8, 2003

(54) FAULT LOCATOR FOR RADIAL SUB-TRANSMISSION AND DISTRIBUTION SYSTEMS

(75) Inventors: Ratan Das, Allentown, PA (US); Joseph P. Benco, Keyport, NJ (US)

(73) Assignee: ABB, Inc., Norwalk, CT (US)

( * ) Notice: Subject to any disclaimer, the term of this patent is extended or adjusted under 35 U.S.C. 154(b) by 0 days.

(21) Appl. No.: 09/558,797

(22) Filed: Apr. 26, 2000

(51) Int. Cl.[7] .............................................. G01R 31/08
(52) U.S. Cl. ............................ 702/58; 702/60; 702/61; 702/64; 702/32; 702/108; 702/182
(58) Field of Search ..................... 702/57–59, 62, 702/64, 65, 80, 108, 117, 118, 122, 124, 126, 183, 185, 184, 182, 188, FOR 103–106, FOR 111, 134, FOR 135, 170, FOR 171; 361/80, 88, 63, 68, 79, 86, 93, 65, 76, 77, 82, 84, 85; 340/662; 324/509, 523, 520–522, 539, 512, 525; 700/293

(56) References Cited

U.S. PATENT DOCUMENTS

| | | | | |
|---|---|---|---|---|
| 4,148,087 A | * | 4/1979 | Phadke ........................ 361/80 |
| 4,766,549 A | * | 8/1988 | Schweitzer, III et al. ... 364/481 |
| 4,812,995 A | * | 3/1989 | Girgis et al. ................ 364/481 |
| 4,972,290 A | * | 11/1990 | Sun et al. .................... 361/64 |
| 4,996,624 A | * | 2/1991 | Schweitzer, III et al. ..... 361/63 |
| 5,428,549 A | | 6/1995 | Chen .......................... 364/483 |
| 5,455,776 A | * | 10/1995 | Novosel et al. ............. 364/492 |
| 5,550,751 A | * | 8/1996 | Russell ....................... 364/492 |
| 5,661,664 A | * | 8/1997 | Novosel et al. ............. 364/492 |
| 5,773,980 A | * | 6/1998 | Yang .......................... 324/525 |
| 5,839,093 A | * | 11/1998 | Novosel et al. .............. 702/59 |
| 5,956,220 A | * | 9/1999 | Novosel et al. .............. 361/62 |
| 6,307,723 B1 | * | 10/2001 | Hindle et al. ................ 361/63 |

* cited by examiner

Primary Examiner—Marc S. Hoff
Assistant Examiner—Carol S Tsai
(74) Attorney, Agent, or Firm—Woodcock Washburn LLP

(57) ABSTRACT

An improved fault location method may be used to locate faults associated with one or more conductors of an electric power transmission and distribution system. The method includes the steps of detecting a fault; determining whether pre-fault data are available and, if so, using the pre-fault data to compute a load impedance and estimate the fault location using the computed load impedance; if pre-fault data are not available, determining whether pre-fault data are available in a first memory location and, if so, using the pre-fault data to compute a load impedance and estimate the fault location using the computed load impedance; and if pre-fault data are not available in the first memory location, using a pre-fault load impedance from a second memory location in estimating the fault location.

8 Claims, 2 Drawing Sheets

FAULT LOCATOR FOR RADIAL SUB-TRANSMISSION AND DISTRIBUTION SYSTEMS

FIELD OF THE INVENTION

The present invention relates generally to the field of protective relaying, and more particularly to apparatus and methods for locating faults on an electrical transmission line.

BACKGROUND OF THE INVENTION

The present invention is related to the invention described in U.S. Pat. No. 5,428,549, Jun. 27, 1995, titled "Transmission Line Fault Location System" (Chen), which is hereby incorporated by reference in its entirety. More particularly, the present invention provides an improvement that can be applied to radial sub-transmission and distribution systems in situations where pre-fault load information is not available. This situation is encountered during auto-reclosing and switch-into-fault situations. If the pre-fault load is below a pre-determined value, then for computing purposes it is considered to be absent. Under such situations, the algorithm described in the patent to Chen is inapplicable since it relies on the pre-fault information. The present invention seeks to provide a way to overcome this limitation by using available information and historical data.

SUMMARY OF THE INVENTION

An improved fault location method may be used to locate faults associated with one or more conductors of an electric power transmission and distribution system. The method includes the steps of detecting a fault; determining whether pre-fault data are available and, if so, using the pre-fault data to compute a load impedance and estimate the fault location using the computed load impedance; if pre-fault data are not available, determining whether pre-fault data are available in a first memory location and, if so, using the pre-fault data to compute a load impedance and estimate the fault location using the computed load impedance; and if pre-fault data are not available in the first memory location, using a pre-fault load impedance from a second memory location in estimating the fault location.

Other aspects of the invention are described below.

DETAILED DESCRIPTION OF PREFERRED EMBODIMENTS

Figure 1:
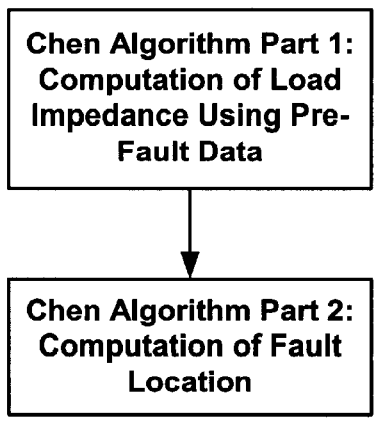
FIG. 1 schematically depicts, in a very simplified way, the algorithm disclosed by Chen in U.S. Pat. No. 5,428,549.
Figure 2:
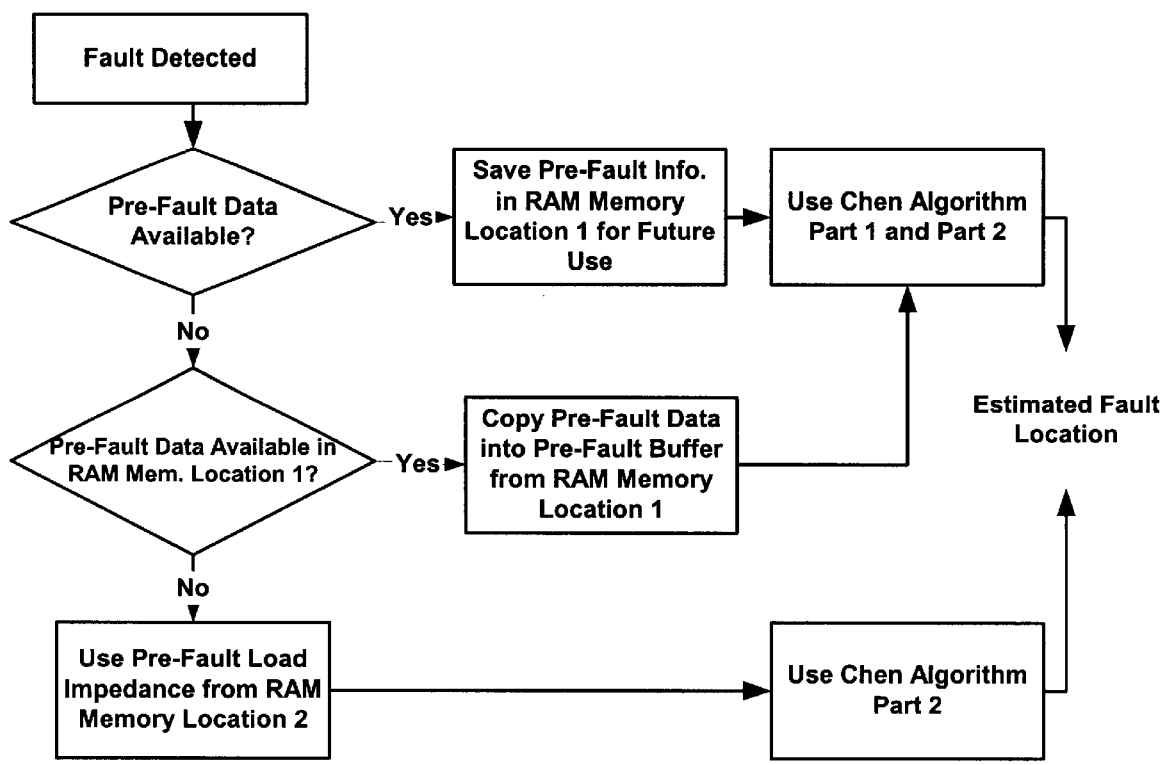
FIG. 2 schematically depicts an improved fault location algorithm for radial sub-transmission and distribution systems in accordance with the present invention.

FIG. 2 depicts an improved fault locator algorithm for radial sub-transmission and distribution systems. This inventive algorithm works in the absence of pre-fault data, and is based on providing the pre-fault load information using historical data. The algorithm disclosed by U.S. Pat. No. 5,428,549, shown in FIG. 1, can be divided into two parts: Part 1 computes the load impedance and Part 2 calculates the fault location using the load impedance computed in Part 1 along with other information.

As shown in FIG. 2, according to the present invention, if the pre-fault data are available, then both Part 1 and Part 2 of Chen's algorithm are used and pre-fault information is saved into RAM memory location 1 for future use. However, if the pre-fault data are not available, then pre-fault data is copied into a pre-fault buffer from RAM memory location 1 saved from a previous fault. It is possible that pre-fault data may not be available in RAM memory location 1. There are two reasons for this: the fault locator may not have estimated a fault location or the fault locator may have been powered down before the present fault and thereby cleared the RAM memory location 1. In such a situation, pre-fault load impedance is picked up from RAM memory location 2, which has a default value of load impedance. Part 2 of the Chen's algorithm is then used. The fault locator computes the default pre-fault load impedance, based on user input, each time the unit is powered up.

Figure 3:
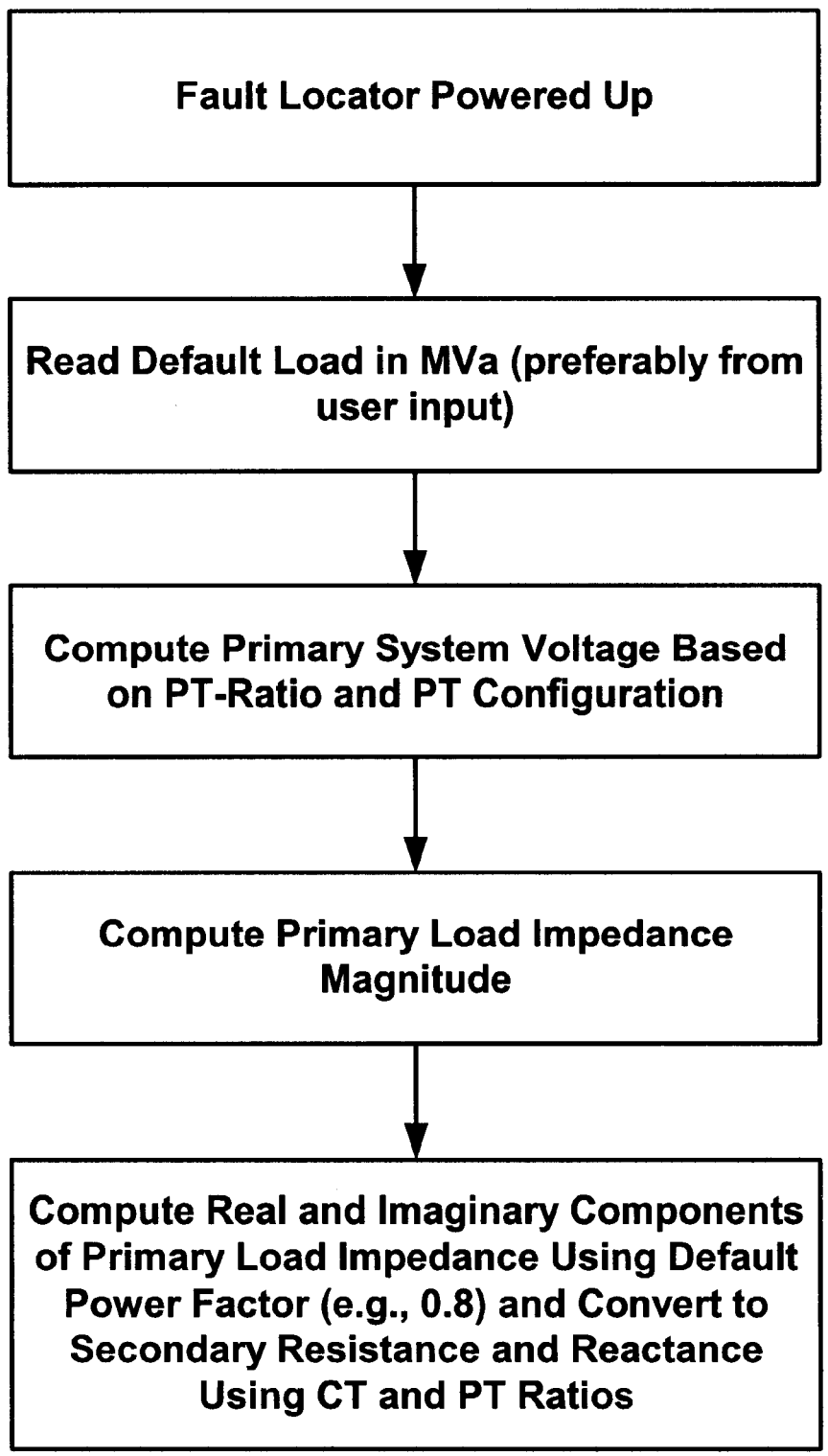
FIG. 3 schematically depicts a process in accordance with the present invention for computing a default load impedance during a power up phase of a fault locator.

Computation of the default pre-fault load impedance is illustrated in FIG. 3. As shown, this process entails the following steps. First, the fault locator is powered up and a default load value (for example, in units of MVa) is read. Next, a primary system voltage, based on the potential transformer ratio and configuration, is computed. A primary load impedance magnitude is then computed, and then the real and imaginary parts of the primary load impedance are computed using a default power factor (e.g., 0.8). The primary load impedance value is then converted to secondary resistance and reactance values using the current and potential transformer ratios.

In sum, the present invention provides apparatus and methods for locating faults on an electrical transmission line. The preferred embodiments described herein represent exemplary implementations of the invention. However, the scope of protection of the following claims is not intended to be limited to the specific embodiments disclosed herein.

We claim:

1. An improved method for locating faults associated with one or more conductors of an electric power transmission and distribution system, wherein the method is employed in a system including a first memory location for use in storing present pre-fault data relating to a most recent fault condition, a second memory location for use in storing previous pre-fault data relating to a previous fault condition, and a third memory location for use in storing a default load impedance value, the method comprising:

(a) detecting a fault;

(b) determining whether present pre-fault data are available in the first memory location and, if so, using the present pre-fault data to compute a load impedance and estimate the fault location using the computed load impedance;

(c) if present pre-fault data are not available, determining whether previous pre-fault data are available in the second memory location and, if so, using the previous pre-fault data to compute a load impedance and estimate the fault location using the computed load impedance; and (d) if previous pre-fault data are not available in the second memory location, using the default load impedance from the third memory location in estimating the fault location.

2. A method as recited in claim 1, wherein the method is used to locate a fault in a radial sub-transmission and distribution system.

3. A method as recited in claim 1, further comprising the step of computing the default load impedance.

4. A method as recited in claim 3, wherein the default load impedance is computed using the following steps: a fault locator is powered up and a default load value is determined; a primary system voltage is computed based on a potential transformer ratio and configuration; a primary load impedance magnitude is computed; real and imaginary parts of the primary load impedance are computed using a default power factor; and the primary load impedance value is converted to secondary resistance and reactance values using the potential transformer ratios.

5. An improved system for locating faults associated with one or more conductors of an electric power transmission and distribution system, comprising:

- a first memory location for use in storing present pre-fault data relating to a most recent fault condition, a second memory location for use in storing previous pre-fault data relating to a previous fault condition, and a third memory location for use in storing a default load impedance value;
- means for detecting a fault;
- means for determining whether present pre-fault data are available in the first memory location and for using the present pre-fault data, if available, to compute a load impedance and estimate the fault location using the computed load impedance;
- means determining whether previous pre-fault data are available in the second memory location, and for using the previous pre-fault data, if available, to compute a load impedance and estimate the fault location using the computed load impedance; and
- means for using the default load impedance from the third memory location in estimating the fault location, if previous pre-fault data are not available in the second memory location.

6. A system as recited in claim 5, wherein the system is used to locate a fault in a radial sub-transmission and distribution system.

7. A system as recited in claim 5, further comprising means for computing the default load impedance.

8. A system as recited in claim 7, wherein the means for computing the default load impedance comprises means for performing the following steps: determining a default load value; computing a primary system voltage based on a potential transformer ratio and configuration; computing a primary load impedance magnitude; computing real and imaginary parts of the primary load impedance; and converting the primary load impedance value to secondary resistance and reactance values.

* * * * *